(12) United States Patent
Aoki et al.

(10) Patent No.: US 6,903,610 B2
(45) Date of Patent: Jun. 7, 2005

(54) OPERATIONAL AMPLIFYING CIRCUIT AND PUSH-PULL CIRCUIT

(75) Inventors: Mitsuru Aoki, Aichi-ken (JP); Hiroshi Imai, Kariya (JP)

(73) Assignee: Denso Corporation, Kariya (JP)

( * ) Notice: Subject to any disclaimer, the term of this patent is extended or adjusted under 35 U.S.C. 154(b) by 39 days.

(21) Appl. No.: 10/606,939

(22) Filed: Jun. 27, 2003

(65) Prior Publication Data

US 2004/0036535 A1 Feb. 26, 2004

(30) Foreign Application Priority Data

Jun. 28, 2002 (JP) ....................................... 2002-189571

(51) Int. Cl.[7] ................................................. H03F 3/26
(52) U.S. Cl. .......................... 330/267; 330/255; 330/268
(58) Field of Search ................................ 330/267, 255, 330/268

(56) References Cited

U.S. PATENT DOCUMENTS

| 4,439,743 | A | * | 3/1984 | Schwarz et al. ............ 330/267 |
| 5,754,078 | A | | 5/1998 | Tamagawa |
| 5,825,247 | A | * | 10/1998 | Herrlinger .................. 330/265 |
| 5,990,742 | A | * | 11/1999 | Suzuki ........................ 330/253 |
| 6,208,208 | B1 | | 3/2001 | Komatsu et al. |
| 6,414,549 | B1 | * | 7/2002 | Barbetta ..................... 330/264 |
| 6,741,133 | B2 | * | 5/2004 | Kinsho et al. .............. 330/263 |

FOREIGN PATENT DOCUMENTS

| JP | 6-132797 | 5/1994 |
| JP | 7-297653 | 11/1995 |
| JP | 8-293740 | 11/1996 |
| JP | 8-307224 | 11/1996 |
| JP | 10-313587 | 11/1998 |
| JP | 11-308057 | 11/1999 |

* cited by examiner

*Primary Examiner*—Patricia Nguyen
(74) *Attorney, Agent, or Firm*—Posz Law Group, PLC

(57) ABSTRACT

In an operational amplifying circuit, the first transistor is configured to turn on and off according to an output signal outputted from the operational amplifier through the output terminal thereof. The second transistor is connected to the first transistor in series and configured to turn off and on reversely with the on and off operation of the first transistor on the output signal from the operational amplifier. The current control unit is electrically connected to the first and second transistors and configured to detect a current flowing in one of the first and second transistors. The current control circuit is configured to cause a current to flow into the control terminal of the one of the first and second transistors and to make other of the first and second transistors turn off.

14 Claims, 2 Drawing Sheets

OPERATIONAL AMPLIFYING CIRCUIT AND PUSH-PULL CIRCUIT

BACKGROUND OF THE INVENTION

1. Field of the Invention

The present invention relates to an operational amplifying circuit having an operational amplifier, and a push-pull circuit.

2. Description of the Related Art

Conventional operational amplifying circuits each having a push-pull circuit disposed at its output stage are widely known, one of which is shown in FIG. 3 for example.

In the above configuration, the operational amplifier 111 changes each base voltage of each of the NPN transistor 121 and PNP transistor 122 according to the input signals from its input terminals 111a and 111b, driving a load (not shown) connected to the output terminal 102a of the output circuit 102.

When the output voltage of the operational amplifier 111 has the low level, the transistor 121 turns off and the transistor 122 reversely turns on so that the transistor 122 pulls the current from the load connected to the output terminal 102a.

In contrast, when the output voltage of the operational amplifier 111 has the high level, the transistor 121 turns on and the transistor 122 reversely turns off so that the transistor 121 pushes the current into the load connected to the output terminal 102a.

The configuration of the operational amplifying circuit, however, while the output voltage of the operational amplifier 111 turns from the low level to the high level, or from the high level to the low level, the transistors 121 and 122 simultaneously turn off, respectively, when the output voltage of the operational amplifier 111 turns the voltage level close to the intermediate voltage (VCC/2) between the supply voltage VCC of the power source PS and the ground voltage, causing the output waveform of the current outputted through the output terminal 102a to be discontinuous.

An occurrence of the state that the transistors 121 and 122 simultaneously completely turn off so that no currents are outputted through the output terminal 102a of the output circuit 102 until either the transistor 121 or the transistor 122 turns on again causes this discontinuity also called "switching distortion".

SUMMARY OF THE INVENTION

FIG. 4 shows a circuit diagram of an operational amplifying circuit configured to improve the switching distortion.

As shown in FIG. 4, the operational amplifying circuit comprises diodes 114 and 115, in addition to the configuration in FIG. 3, each of which is inserted between the output terminal of the operational amplifier 111 and each of the bases of the transistors 121 and 122.

Each of the diodes 114 and 115 keeps the voltage between each of the bases of the transistors 121 and 122 at the forward-biased voltage of two diodes of approximately 1.2 V so as to set the output voltage of the operational amplifier 111 to the voltage close to the threshold value of each of the transistors 121 and 122.

In this configuration, the forward voltage of 0.6 V of the diode 114 makes cancel the base-emitter voltage (0.6 V) between the base and the emitter of the transistor 121, and similarly, the forward voltage of 0.6 V of the diode 115 makes cancel the base-emitter voltage (0.6 V) between the base and the emitter of the transistor 122.

As a result, switching (turning on and off) each of the transistors 121 and 122 without depending on the driving voltage required for driving each of the transistors 121 and 122 allows the switching distortion to be improved.

In the above configuration shown in FIG. 4, however, the diodes 114 and 115 cause the base voltage of each of the transistors 121 and 122 to set to the voltage close to the threshold voltage of each of the transistors 121 and 122 so that the transistors 121 and 122 may turn on simultaneously.

When the transistors 121 and 122 turn on simultaneously, the short-circuit current flows from the power source PS through the transistors 121 and 122. The short-circuit current makes increase the current consumption of each of the transistors 121 and 122, decreasing the capability of supplying the current through the output terminal 102a of the output circuit 102.

In addition, the longer the rise time and the fall time of each of the base voltages of each of the transistors 121 and 122 are, the longer the time during which the transistors 121 and 122 simultaneously turn on, thereby increasing the short-circuit current.

The present invention is made on the background.

Accordingly, it is an object of the present invention to provide an operational amplifying circuit which is capable of improving the switching distortion and decreasing the short-circuit current occurring when the transistors are switched (turn on and off.

In order to achieve the object, according to one aspect of the present invention, there is provided an operational amplifying circuit comprising: an operational amplifier with an output terminal; a first transistor having a control terminal and electrically connected to the operational amplifier, said first transistor being configured to turn on and off according to an output signal outputted from the operational amplifier through the output terminal thereof; a second transistor having a control terminal and electrically connected to the operational amplifier, said second transistor being connected to the first transistor in series, said second transistor being configured to turn off and on reversely with the on and off operation of the first transistor according to the output signal from the operational amplifier; and a current control unit electrically connected to the first and second transistors and configured to detect a current flowing in one of the first and second transistors, said current control circuit being configured to cause a current to flow into the control terminal of the one of the first and second transistors and to make other of the first and second transistors turn off.

In order to achieve the object, according to another aspect of the present invention, there is provided a push-pull circuit comprising: a first transistor having a control terminal and configured to turn on and off according to an input signal inputted thereto; a second transistor having a control terminal and electrically connected to the first transistor in series, said second transistor being configured to turn off and on reversely with the on and off operation of the first transistor according to the input signal; and a current control unit electrically connected to the first and second transistors and configured to detect a current flowing in one of the first and second transistors, said current control circuit being configured to cause a current to flow into the control terminal of the one of the first and second transistors and to make other of the first and second transistors turn off.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the invention will be described hereinafter with reference to the accompanying drawings.

(First Embodiment)

Figure 1:
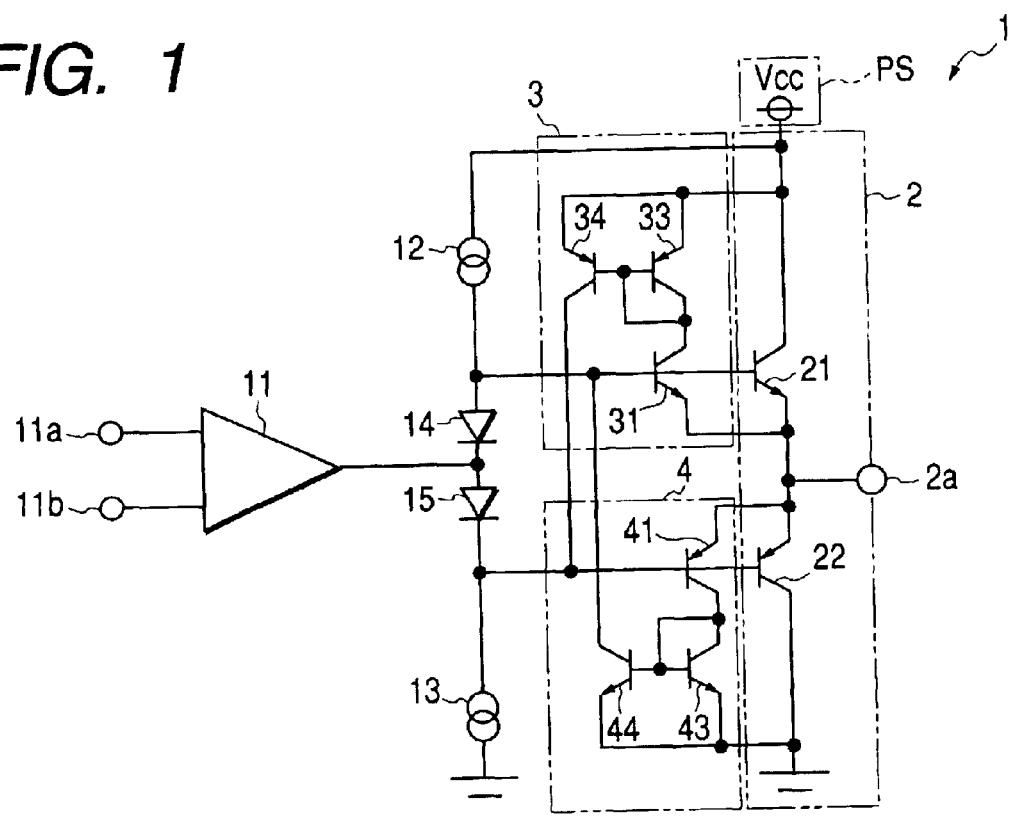
FIG. 1 is an electrical diagram of an operational amplifying circuit related to a first embodiment of the present invention.

FIG. 1 illustrates an electrical diagram of an operational amplifying circuit 1.

As shown in FIG. 1, the operational amplifying circuit 1 comprises an output circuit 2, a first current control circuit 3 electrically connected thereto, a second current control circuit 4 electrically connected to the output circuit 2 and the first current control circuit 3 and an operational amplifier 11 with input terminals 11a and 11b.

The operational amplifying circuit 1 also comprises constant power sources 12 and 13.

The output circuit 2 comprises NPN transistor 21 and PNP transistor 22. The collector of the NPN transistor 21 is electrically connected to a power source PS capable of supplying the voltage of VCC, and the emitter thereof is electrically commonly connected to the emitter of the PNP transistor 22. The collector of the PNP transistor 22 is electrically connected to the ground.

The output circuit 2 is also provided with an output terminal 2a electrically connected to the emitters of the NPN transistor 21 and PNP transistor 22, respectively. The output terminal 2a is electrically connected to a load (not shown).

The operational amplifier 11 is also provided with an output terminal electrically connected to each base of each of the transistors 21 and 22 of the output circuit 2. The output terminal of the operational amplifier 11 is electrically connected through the constant power source 12 to the signal line connecting the power source PS and the collector of the NPN transistor 21. The output terminal of the operational amplifier 11 is also electrically connected through the constant power source 13 to the ground.

The NPN and PNP transistors 21 and 22 are configured to perform push-pull operations according to the output of the operational amplifier 11. That is, the NPN transistors 21 and 22 turn reversely on and off with each other according to the output of the operational amplifier 11.

The operational amplifying circuit 1 also comprises diodes 14 and 15 each of which is inserted between the output terminal of the operational amplifier 11 and each of the bases of the transistors 21 and 22.

Each of the diodes 14 and 15 keeps the voltage between each of the bases of the transistors 21 and 22 at the forward-biased voltage of two diodes of approximately 1.2 V so as to set the output voltage of the operational amplifier 11 to the voltage close to the threshold value of each of the transistors 21 and 22.

The anode of the diode 14 is connected to the base of the transistor 21, the cathode of the diode 14 is connected to the anode of the diode 15 and the cathode of the diode 15 is connected to the base of the transistor 22 so that the diodes 14 and 15 are forwardly connected to each other. The output terminal of the operational amplifier 11 is connected to the cathode of the diode 14 and the anode of the diode 15.

The forward voltage of 0.6 V of the diode 14 is configured to make cancel the base-emitter voltage (0.6 V) between the base and the emitter of the transistor 21, and similarly, the forward voltage of 0.6 V of the diode 15 is configured to make cancel the base-emitter voltage (0.6 V) between the base and the emitter of the transistor 22.

On the other hand, the first base current control circuit 3 comprises PNP bipolar transistors 33, 34 which are electrically connected to each other in a current mirror configuration, and an NPN bipolar transistor 31 electrically connected to the PNP bipolar transistor 33 in series.

That is, the bases of PNP bipolar transistors 33 and 34 are electrically commonly connected to each other, and each emitter of each of the PNP bipolar transistors 33 and 34 is electrically connected to the power source PS.

The collector of PNP bipolar transistor 34 is electrically connected to the base of transistor 22.

The NPN bipolar transistor 31 is electrically connected between the collector of PNP bipolar transistor 33 and the emitter of transistor 21. That is, the collector of NPN bipolar transistor 31 is electrically connected to the collector of PNP bipolar transistor 33, and the emitter of NPN bipolar transistor 31 is electrically connected to the emitter of transistor 21 so that the collector of NPN bipolar transistor 31 is connected to the commonly connected bases of PNP bipolar transistors 33 and 34.

The base of NPN bipolar transistor 31 is commonly connected to the base of transistor 21.

The second base current control circuit 4 comprises NPN bipolar transistors 43, 44 which are electrically connected to each other in a current mirror configuration, and a PNP bipolar transistor 41 electrically connected to the NPN bipolar transistor 43 in series.

That is, the bases of NPN bipolar transistors 43 and 44 are electrically commonly connected to each other, and each emitter of each of the NPN bipolar transistors 43 and 44 is electrically connected to the ground.

The collector of NPN bipolar transistor 44 is electrically connected to the base of transistor 21.

The PNP bipolar transistor 41 is electrically connected between the collector of NPN bipolar transistor 43 and the emitter of transistor 22. That is, the collector of PNP bipolar transistor 41 is electrically connected to the collector of NPN bipolar transistor 43, and the emitter of PNP bipolar transistor 41 is electrically connected to the emitter of transistor 22 so that the collector of PNP bipolar transistor 41 is connected to the commonly connected bases of NPN bipolar transistors 43 and 44.

The base of PNP bipolar transistor 41 is commonly connected to the base of transistor 22.

Next, operations of the operational amplifying circuit 1 will be described hereinafter.

In the above configuration of the operational amplifying circuit 1, the base of transistor 21 and that of transistor 31 are commonly connected to each other, allowing the current proportional to the current flowing in the transistor 21 to flow in the transistor 31.

Similarly, the base of transistor 22 and that of transistor 41 are commonly connected to each other, allowing the current proportional to the current flowing in the transistor 22 to flow in the transistor 41.

The operational amplifier 11 outputs the output voltage through the output terminal according to the signals from its input terminals 11a and 11b, applying the output voltage on each base of each of the transistors 21, 31, 22 and 41.

When the output voltage of the operational amplifier 11 has the low level, the transistor 21 turns off and the transistor 22 reversely turns on so that the transistor 22 pulls the current from the load connected to the output terminal 2a.

At that time, the forward voltage of 0.6 V of the diode 14 makes cancel the base-emitter voltage (0.6 V) between the base and the emitter of the transistor 21, and the forward voltage of 0.6 V of the diode 15 makes cancel the base-emitter voltage (0.6 V) between the base and the emitter of the transistor 22, allowing each of the transistors 21 and 22 to switch (turn) on and off without depending on the driving voltage required for driving each of the transistors 21 and 22, thereby improving the switching distortion.

In cases where the output voltage of the operational amplifier 11 turns to the high level from the low level, the transistor 21 turns on so that the transistors 21 and 22 simultaneously are on state.

Then, in the first embodiment, the base of transistor 31 is electrically commonly connected to the base of transistor 21 so that the current supplied from the constant current source 12 flows in each of the transistors 21 and 31, and further the current flows in the transistor 33 connected to the transistor 31 in series and the transistor 34 connected to the transistor 33 in current mirror configuration, respectively.

Because the collector of transistor 34 is electrically connected to the base of transistor 22, the current flowing in the transistor 34 further flows into the base of transistor 22 so that the base voltage of transistor 22 rapidly increases, causing the transistor 22 to immediately turn off.

In the first embodiment, therefore, even in cases where the transistors 21 and 22 simultaneously turn on, the first base current control circuit 3 allows the transistor 22 to rapidly turn off from its on state, making it possible to decrease the short-circuit current flowing in the transistors 21 and 22.

On the other hand, when the output voltage of the operational amplifier 11 has the high level, the transistor 21 turns on and the transistor 22 reversely turns off so that the transistor 21 pushes the current into the load connected to the output terminal 2a.

At that time, as described above, the diodes 14 and 15 allows each of the transistors 21 and 22 to switch (turn) on and off without depending on the driving voltage required for driving each of the transistors 21 and 22, thereby improving the switching distortion.

In cases where the output voltage of the operational amplifier 11 turns to the low level from the high level so that the transistors 21 and 22 simultaneously are on state.

Then, in the first embodiment, the base of transistor 41 is electrically commonly connected to the base of transistor 22 so that the current flows in each of the transistors 22 and 41 to the constant current source 13, and further the current flows in the transistor 43 connected to the transistor 41 in series and the transistor 44 connected to the transistor 43 in current mirror configuration, respectively.

Because the collector of transistor 44 is electrically connected to the base of transistor 21, the current flowing in the transistor 44 further flows into the base of transistor 21 so that the current is drawn from the base of transistor 21 through the transistor 44 into the ground, causing the base voltage of transistor 21 to rapidly decrease. The decrease of the base voltage of transistor 21 causes the transistor 21 to immediately turn off.

In the first embodiment, therefore, even in cases where the transistors 21 and 22 simultaneously turn on, the second base current control circuit 4 allows the transistor 21 to rapidly turn off from its on state, making it possible to decrease the short-circuit current flowing in the transistors 21 and 22.

As described above, when switching each of the transistors 21 and 22, the first base current control circuit 3 causes the current to flow into the base of transistor 22 and the second base current control circuit 4 causes the current to flow from the base of transistor 21, allowing the transistor 22 or the transistor 21 to rapidly turn off from its on state.

Rapidly tuning the transistor 22 or the transistor 21 off permits the switching (turning) times of the transistor 22 or the transistor 21, that is, the rise time and fall time of the base of the transistor 22 or the transistor 21 to be short, making it possible to decrease the short-circuit current flowing in the transistors 21 and 22.

It is possible, therefore, to prevent the current consumption of each of the transistors 21 and 22 due to the short-circuit current from increasing, and to keep high the capability of supplying the current through the output terminal 2a of the output circuit 2 of the output circuit 2.

(Second Embodiment)

Figure 2:
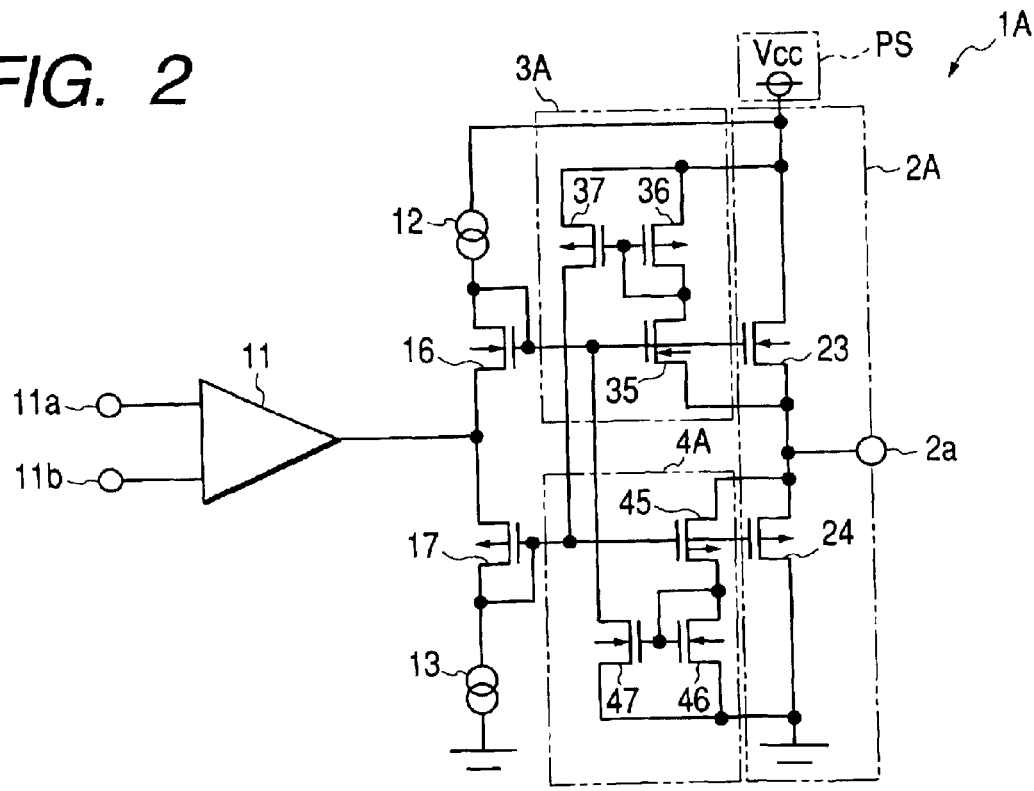
FIG. 2 is an electrical diagram of an operational amplifying circuit related to a second embodiment of the present invention.
Figure 3:
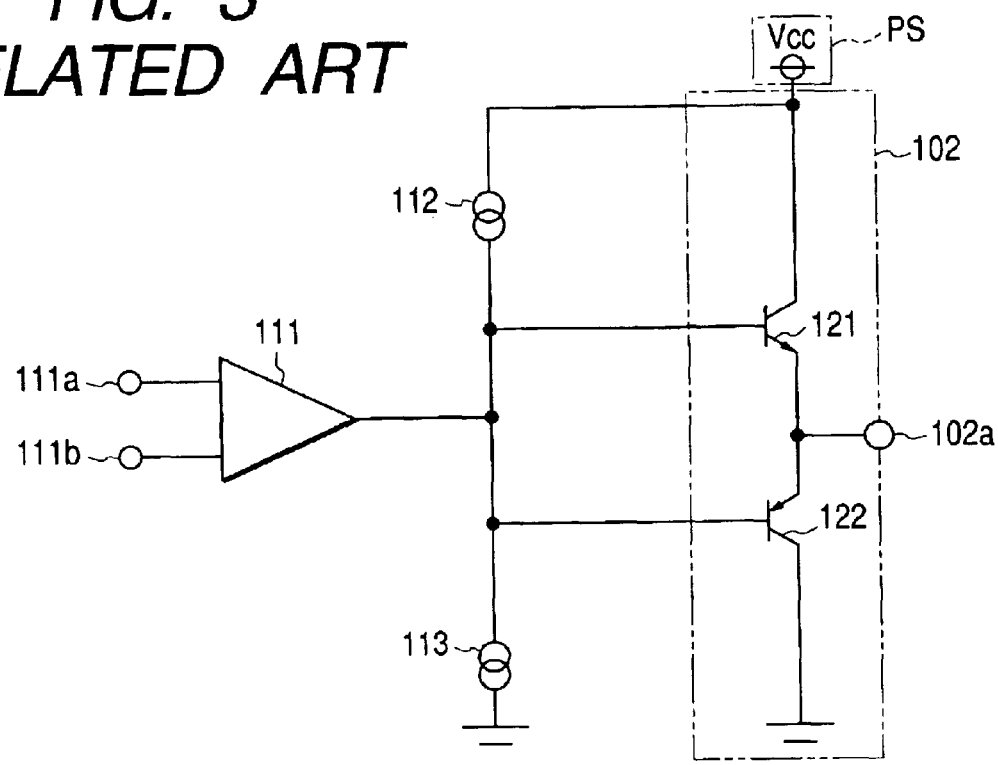
FIG. 3 is an electrical diagram of an operational amplifying circuit according to the related art.
Figure 4:
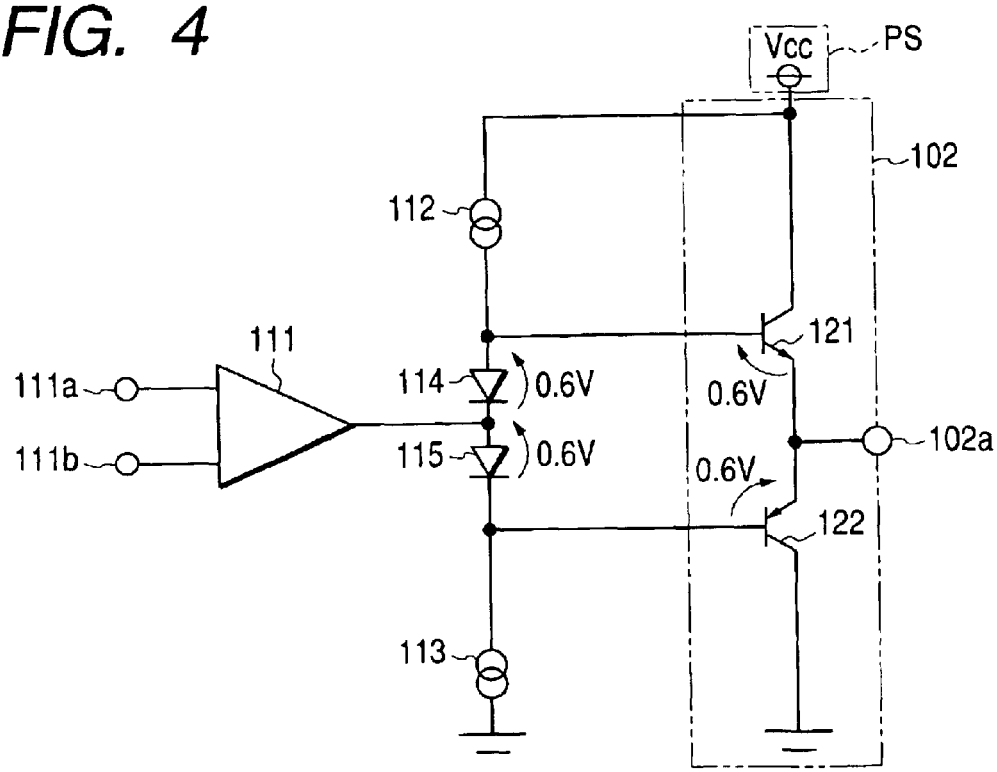
FIG. 4 is an electrical diagram of an operational amplifying circuit.

FIG. 2 illustrates an electrical diagram of an operational amplifying circuit 1A.

In FIG. 2, the elements which are the same as those in FIG. 1 are assigned to the same reference characteristics of the elements in FIG. 1.

The operational amplifying circuit 1A comprises N channel MOS (Metal Oxide Semiconductor) transistors 16 and 23 with which the diode 14 and the NPN transistor 21 of the first embodiment are replaced, respectively.

The operational amplifying circuit 1A also comprises a first gate current control circuit 3A having N channel MOS transistors 35, 46 and 47 with which the transistors 31, 43 and 44 of the first base current control circuit 3 are replaced, respectively.

As the MOS transistors, insulated gate bipolar transistors can be utilized.

In addition, the operational amplifying circuit 1A comprises P channel MOS transistors 17 and 24 with which the diode 15 and the PNP transistor 22 of the first embodiment are replaced, respectively.

The operational amplifying circuit 1A also comprises a second gate current control circuit 4A having P channel MOS transistors 36, 37 and 45 with which the transistors 33, 34 and 41 of the second base current control circuit 4 are replaced, respectively.

The drain of the P channel MOS transistor 23 is electrically connected to the power source PS capable of supplying the voltage of VCC, and the source thereof is electrically commonly connected to the source of the P channel MOS transistor 24. The drain of the P channel MOS transistor 24 is electrically connected to the ground.

The output terminal 2a is electrically connected to the sources of the N channel MOS transistor 23 and P channel MOS transistor 24, respectively. The output terminal of the operational amplifier 11 is electrically connected to each gate of each of the transistors 23 and 24 of the output circuit 2. The output terminal of the operational amplifier 11 is connected through the constant power source 12 to the signal line connecting the power source PS and the drain of the N channel MOS transistor 23.

The N channel and P channel MOS transistors 23 and 24 are configured to perform push-pull operations according to the output of the operational amplifier 11.

The gate of N channel MOS transistor 16 is commonly connected to the gate of N channel transistor 23 and its drain so that the gate-source voltage between the gate and the source of the transistor 16 is configured to make cancel the gate-source voltage between the gate and the source of the transistor 23.

Similarly, the gate of P channel MOS transistor 17 is commonly connected to the gate of P channel transistor 24 and its drain so that the gate-source voltage between the gate and the source of the transistor 17 is configured to make cancel the gate-source voltage between the gate and the source of the transistor 24.

The P channel MOS transistors 36, 37 which are electrically connected to each other in a current mirror configuration, and an N channel MOS transistor 35 electrically connected to the P channel MOS transistor 36 in series.

That is, the gates of P channel MOS transistors 36 and 37 are electrically commonly connected to each other, and each source of each of the P channel MOS transistors 36 and 37 is electrically connected to the power source PS.

The drain of P channel MOS transistor 37 is electrically connected to the gate of transistor 24.

The N channel MOS transistor 35 is electrically connected between the drain of P channel MOS transistor 36 and the source of transistor 23. That is, the drain of N channel MOS transistor 35 is electrically connected to the drain of P channel MOS transistor 36, and the source of N channel MOS transistor 35 is electrically connected to the source of transistor 23 so that the drain of N channel MOS transistor 35 is connected to the commonly connected gates of P channel MOS transistors 36 and 37.

The gate of N channel MOS transistor 35 is commonly connected to the gate of transistor 23.

The second gate current control circuit 4A comprises N channel MOS transistors 46, 47 which are electrically connected to each other in a current mirror configuration, and a P channel MOS transistor 45 electrically connected to the N channel MOS transistor 46 in series.

That is, the gates of N channel MOS transistors 46 and 47 are electrically commonly connected to each other, and each source of each of the N channel MOS transistors 46 and 47 is electrically connected to the ground.

The drain of N channel MOS transistor 47 is electrically connected to the gate of transistor 23.

The P channel MOS transistor 45 is electrically connected between the drain of N channel MOS transistor 46 and the source of transistor 24. That is, the drain of P channel MOS transistor 45 is electrically connected to the drain of N channel MOS transistor 46, and the source of P channel MOS transistor 45 is electrically connected to the source of transistor 24 so that the drain of P channel MOS transistor 45 is connected to the commonly connected gates of N channel MOS transistors 46 and 47.

The gate of P channel MOS transistor 45 is commonly connected to the gate of transistor 24.

Next, operations of the operational amplifying circuit 1A will be described hereinafter.

In the above configuration of the operational amplifying circuit 1A, the gate of transistor 23 and that of transistor 35 are commonly connected to each other, allowing the current proportional to the current flowing in the transistor 23 to flow in the transistor 35.

Similarly, the gate of transistor 24 and that of transistor 45 are commonly connected to each other, allowing the current proportional to the current flowing in the transistor 24 to flow in the transistor 45.

The operational amplifier 11 outputs the output voltage through the output terminal according to the signals from its input terminals 11a and 11b, applying the output voltage on each gate of each of the transistors 23, 35, 24 and 45.

When the output voltage of the operational amplifier 11 has the low level, the transistor 23 turns off and the transistor 24 reversely turns on so that the transistor 24 pulls the current from the load connected to the output terminal 2a.

At that time, the gate-source voltage of the transistor 16 makes cancel the gate-source voltage of the transistor 23, and the gate-source voltage of the transistor 17 makes cancel the gate-source voltage of the transistor 24, allowing each of the transistors 23 and 24 to switch (turn) on and off without depending on the driving voltage required for driving each of the transistors 23 and 24, thereby improving the switching distortion, similarly to the first embodiment.

In cases where the output voltage of the operational amplifier 11 turns to the high level from the low level, the transistor 23 turns on so that the transistors 23 and 24 simultaneously are on state.

Then, in the second embodiment, the gate of transistor 35 is electrically commonly connected to the gate of transistor 23 so that the current flows in each of the transistors 23 and 35, and further the current flows in the transistor 36 connected to the transistor 35 in series and the transistor 37 connected to the transistor 36 in current mirror configuration, respectively.

Because the drain of transistor 37 is electrically connected to the gate of transistor 24, the current flowing in the transistor 37 further flows into the gate of transistor 24 so that the gate voltage of transistor 24 rapidly increases, causing the transistor 24 to immediately turn off.

On the other hand, when the output voltage of the operational amplifier 11 has the high level, the transistor 23 turns on and the transistor 24 reversely turns off so that the transistor 23 pushes the current into the load connected to the output terminal 2a.

In cases where the output voltage of the operational amplifier 11 turns to the low level from the high level so that the transistors 23 and 24 simultaneously are on state.

Then, in the second embodiment, the gate of transistor 45 is electrically commonly connected to the gate of transistor 24 so that the current flows in each of the transistors 24 and 45, and further the current flows in the transistor 46 connected to the transistor 45 in series and the transistor 47 connected to the transistor 46 in current mirror configuration, respectively.

Because the drain of transistor 47 is electrically connected to the gate of transistor 23, the current flowing in the transistor 47 further flows into the gate of transistor 23 so that the current is drawn from the gate of transistor 23 through the transistor 47 into the ground, causing the gate voltage of transistor 23 to rapidly decrease. The decrease of the gate voltage of transistor 23 causes the transistor 23 to immediately turn off.

As described above, in the second embodiment, when switching each of the transistors 23 and 24, the first gate current control circuit 3A causes the current to flow into the gate of transistor 24 and the second gate current control circuit 4A causes the current to flow from the gate of transistor 23, allowing the transistor 24 or the transistor 23 to rapidly turn off from its on state.

Rapidly tuning the transistor 24 or the transistor 23 off permits the switching (turning) times of the transistor 24 or the transistor 23, that is, the rise time and fall time of the gate of the transistor 24 or the transistor 23 to be short, making it possible to decrease the short-circuit current flowing in the transistors 23 and 24.

It is possible, therefore, to prevent the current consumption of each of the transistors 23 and 24 due to the short-circuit current from increasing, and to keep high the capability of supplying the current through the output terminal 2a of the output circuit 2A of the output circuit 2.

In the first and second embodiments, the present invention is applied as the operational amplifying circuit, but the present invention is not limited to the application.

That is, the present invention may be applied as a push-pull circuit having the output circuit 2 (or 2A) and at least one of the first base current control circuit 3 (or first gate current control circuit 3A) and the second base current control circuit 4 (or second gate current control circuit 4A).

In addition, the diodes 14 and 15 (or the transistors 16 and 17) may be omitted from the operational amplifying circuit 1 (or 1A).

While there has been described what is at present considered to be the embodiments and modifications of the invention, it will be understood that various modifications which are not described yet may be made therein, and it is intended to cover in the appended claims all such modifications as fall within the true spirit and scope of the invention.

This application is based upon and claims the benefit of priority of the prior Japanese Patent Application 2002-189571 filed on Jun. 28, 2002 so that the contents of which are incorporated herein by reference.

What is claimed is:

1. An operational amplifying circuit comprising:
   an operational amplifier with an output terminal;
   a first transistor having a control terminal and electrically connected to the operational amplifier, said first transistor being configured to turn on and off according to an output signal outputted from the operational amplifier through the output terminal thereof;
   a second transistor having a control terminal and electrically connected to the operational amplifier, said second transistor being connected to the first transistor in series, said second transistor being configured to turn off and on reversely with the on and off operation of the first transistor according to the output signal from the operational amplifier; and
   a current control unit electrically connected to the first and second transistors and configured to detect a current flowing in one of the first and second transistors, said current control circuit being configured to cause a current to flow into the control terminal of the other of the first and second transistors and to make the other of the first and second transistors turn off.

2. The operational amplifying circuit according to claim 1, wherein said current control unit comprises a first current control circuit electrically connected to the first and second transistors and configured to detect the current flowing in the first transistor, said first current control circuit being configured to cause the current to flow into the control terminal of the second transistor and to make the second transistor turn off.

3. The operational amplifying circuit according to claim 1, wherein said current control unit comprises a second current control circuit electrically connected to the first and second transistors and configured to detect the current flowing in the second transistor, said second current control circuit being configured to draw the current from the control terminal of the first transistor into the second current control circuit and to make the first transistor turn off.

4. The operational amplifying circuit according to claim 1, further comprising a first canceling unit electrically connected to the output terminal of the operational amplifier and the control terminal of the first transistor, said first canceling unit being configured to cancel a voltage between the control terminal of the first transistor and a connection point of the first and second transistors.

5. The operational amplifying circuit according to claim 1, further comprising a second canceling unit electrically connected to the output terminal of the operational amplifier and the control terminal of the second transistor, said second canceling unit being configured to cancel a voltage between the control terminal of the second transistor and a connection point of the first and second transistors.

6. An operational amplifying circuit comprising:
   an operational amplifier with an output terminal;
   a first transistor having a control terminal and electrically connected to the operational amplifier, said first transistor being configured to turn on and off according to an output signal outputted from the operational amplifier through the output terminal thereof;
   a second transistor having a control terminal and electrically connected to the operational amplifier, said second transistor being connected to the first transistor in series, said second transistor being configured to turn off and on reversely with the on and off operation of the first transistor according to the output signal from the operational amplifier; and
   a current control unit comprising a first current control circuit electrically connected to the first and second transistors and configured to detect the current flowing in the first transistor,
   said first current control circuit being configured to cause the current to flow into the control terminal of the second transistor and to make the second transistor turn off,
   said first current control circuit further comprising:
   a third transistor having a control terminal commonly connected to the control terminal of the first transistor, said third transistor being configured to detect the current flowing in the control terminal of the first transistor;
   a fourth transistor connected to the third transistor in series; and
   a fifth transistor connected to the fourth transistor in a current mirror configuration, said fifth transistor being configured to cause the current to flow into the control terminal of the second transistor.

7. The operational amplifying circuit according to claim 6, wherein said first, second, third, fourth and fifth transistors are bipolar transistors, respectively, and each of said control terminals of each of the first, second and third transistors is a base thereof.

8. The operational amplifying circuit according to claim 6, wherein said first, second, third, fourth and fifth transistors are metal oxide semiconductor transistors, respectively, and each of said control terminals of each of the first, second and third transistors is a gate thereof.

9. An operational amplifying circuit comprising:
   an operational amplifier with an output terminal;
   a first transistor having a control terminal and electrically connected to the operational amplifier, said first transistor being configured to turn on and off according to an output signal outputted from the operational amplifier through the output terminal thereof;

a second transistor having a control terminal and electrically connected to the operational amplifier, said second transistor being connected to the first transistor in series, said second transistor being configured to turn off and on reversely with the on and off operation of the first transistor according to the output signal from the operational amplifier; and a current control unit comprising a second current control circuit electrically connected to the first and second transistors and configured to detect the current flowing in the second transistor, said second current control circuit being configured to draw the current from the control terminal of the first transistor into the second current control circuit and to make the first transistor turn off, said second current control circuit further comprising:
- a sixth transistor having a control terminal commonly connected to the control terminal of the second transistor, said sixth transistor being configured to detect the current flowing in the control terminal of the second transistor;
- a seventh transistor connected to the sixth transistor in series; and
- an eighth transistor connected to the seventh transistor in a current mirror configuration, said eighth transistor drawing the current from the control terminal of the first transistor into the control terminal of the second control circuit.

10. The operational amplifying circuit according to claim 9, wherein said first, second, sixth, seventh and eighth transistors are bipolar transistors, respectively, and each of said control terminals of each of the first, second and sixth transistors is a base thereof.

11. The operational amplifying circuit according to claim 9, wherein said first, second, sixth, seventh and eighth transistors are metal oxide semiconductor transistors, respectively, and each of said control terminals of each of the first, second and sixth transistors is a gate thereof.

12. A push-pull circuit comprising:

a first transistor having a control terminal and configured to turn on and off according to an input signal inputted thereto;

a second transistor having a control terminal and electrically connected to the first transistor in series, said second transistor being configured to turn off and on reversely with the on and off operation of the first transistor according to the input signal; and a current control unit electrically connected to the first and second transistors and configured to detect a current flowing in one of the first and second transistors, said current control circuit being configured to cause a current to flow into the control terminal of the other of the first and second transistors and to make the other of the first and second transistors turn off.

13. The push-pull circuit according to claim 12, wherein said current control unit comprises a first current control circuit electrically connected to the first and second transistors and configured to detect the current flowing in the first transistor, said first current control circuit being configured to cause the current to flow into the control terminal of the second transistor and to make the second transistor turn off.

14. The push-pull circuit according to claim 12, wherein said current control unit comprises a second current control circuit electrically connected to the first and second transistors and configured to detect the current flowing in the second transistor, said second current control circuit being configured to draw the current from the control terminal of the first transistor into the second current control circuit and to make the first transistor turn off.

* * * * *